US010026623B2

(12) United States Patent
Mizumura

(10) Patent No.: US 10,026,623 B2
(45) Date of Patent: Jul. 17, 2018

(54) THIN FILM TRANSISTOR SUBSTRATE, DISPLAY PANEL, AND LASER ANNEALING METHOD

(71) Applicant: V TECHNOLOGY CO., LTD., Kanagawa (JP)

(72) Inventor: Michinobu Mizumura, Kanagawa (JP)

(73) Assignee: V TECHNOLOGY CO., LTD., Kanagawa (JP)

( * ) Notice: Subject to any disclaimer, the term of this patent is extended or adjusted under 35 U.S.C. 154(b) by 0 days.

(21) Appl. No.: 15/556,728

(22) PCT Filed: Feb. 15, 2016

(86) PCT No.: PCT/JP2016/054286
§ 371 (c)(1),
(2) Date: Sep. 8, 2017

(87) PCT Pub. No.: WO2016/143462
PCT Pub. Date: Sep. 15, 2016

(65) Prior Publication Data
US 2018/0061661 A1 Mar. 1, 2018

(30) Foreign Application Priority Data

Mar. 11, 2015 (JP) .................................. 2015-048394

(51) Int. Cl.
*H01L 21/324* (2006.01)
*H01L 21/268* (2006.01)
(Continued)

(52) U.S. Cl.
CPC .......... *H01L 21/324* (2013.01); *B23K 26/066* (2015.10); *B23K 26/0648* (2013.01);
(Continued)

(58) Field of Classification Search
None
See application file for complete search history.

(56) References Cited

U.S. PATENT DOCUMENTS

| 2013/0105797 | A1* | 5/2013 | Hayashi | ............ | H01L 29/66765 257/57 |
| 2015/0021561 | A1* | 1/2015 | Jeon | .................. | H01L 29/78696 257/40 |
| 2017/0154901 | A1* | 6/2017 | Nodera | ............... | H01L 27/1222 |

FOREIGN PATENT DOCUMENTS

| JP | 2004-006725 A | 1/2004 |
| JP | 2009-026877 A | 2/2009 |

(Continued)

OTHER PUBLICATIONS

International Search Report in corresponding International Application No. PCT/JP2016/054286, dated May 17, 2016 (5 pages).

(Continued)

*Primary Examiner* — Asok K Sarkar
(74) *Attorney, Agent, or Firm* — Osha Liang LLP

(57) ABSTRACT

A thin film transistor substrate includes a plurality of thin film transistors arranged in columns and rows respectively on a substrate. Each of the thin film transistors includes a laser annealed part in which an amorphous silicon layer that forms a channel region is laser annealed to be a polysilicon layer, each laser annealed part is disposed with a designed pitch in a scanning direction in which a laser light for laser annealing and the substrate move relatively to each other, and the laser annealed part is provided within a channel width formed in a direction orthogonal to the scanning direction and being narrower than the channel width.

9 Claims, 4 Drawing Sheets

(51) Int. Cl.
   *B23K 26/06*    (2014.01)
   *H01L 29/786*   (2006.01)
   *B23K 26/066*   (2014.01)
(52) U.S. Cl.
   CPC ...... *H01L 21/268* (2013.01); *H01L 29/78663* (2013.01); *H01L 29/78696* (2013.01)

(56) References Cited

FOREIGN PATENT DOCUMENTS

| | | |
|---|---|---|
| JP | 2009-289874 A | 12/2009 |
| JP | 2010-283073 A | 12/2010 |
| JP | 2014-120686 A | 6/2014 |

OTHER PUBLICATIONS

Written Opinion for corresponding International Application No. PCT/JP2016/054286, dated May 17, 2016 (7 pages).

* cited by examiner

THIN FILM TRANSISTOR SUBSTRATE, DISPLAY PANEL, AND LASER ANNEALING METHOD

TECHNICAL FIELD

The present invention relates to a thin film transistor substrate, a display panel including the thin film transistor substrate, and a laser annealing method for forming the thin film transistor substrate.

BACKGROUND ART

Thin film transistor substrates are generally known as display panel substrates for active matrix liquid crystal or organic EL panels and include a thin film transistor (TFT) disposed for each of a plurality of pixel electrodes arranged in a dot matrix. In particular, a display panel for color display includes RGB sub pixels put together to be one pixel, and therefore a thin film transistor substrate therefor has a thin film transistor disposed for each of the sub pixels, the number of which is three times that of the pixels.

In recent years, an amorphous silicon TFT with a good switching characteristic has been used as the thin film transistor (hereinafter referred to as "TFT"). The amorphous silicon TFT basically consists of an amorphous silicon layer as a semiconductor layer formed on a gate electrode with an insulating film (gate insulating film) therebetween, a drain electrode and a source electrode are disposed on the amorphous silicon layer, a channel region is formed between the source electrode and the drain electrode on the amorphous silicon layer, and one of the drain electrode and the source electrode is connected to a pixel electrode formed of a transparent conductive film.

The amorphous silicon TFT has a good switching characteristic but the electron mobility thereof is as low as 0.5 $cm^2/Vs$ in the channel region, and the TFT cannot provide high electron mobility required for display panels that will have even higher resolution/higher definition in the future. To address this, in a process of manufacturing a TFT substrate, laser annealing has been carried out, in which an amorphous silicon layer is irradiated with a laser light in a location to be a channel region, melted and recrystallized to form a polycrystalline silicon (polysilicon) layer with high electron mobility.

A conventional laser annealing method is known from PTL 1. According to the method, while a substrate is conveyed in one of the lengthwise and transverse arrangement directions of TFT forming regions set on the substrate, a microlens array including a plurality of lenses disposed corresponding to a plurality of TFT forming regions in a direction intersecting the substrate conveying direction is moved in the direction intersecting the substrate conveying direction, the lenses of the microlens array and the TFT forming regions on the substrate are placed at a position, so that when the TFT forming regions on the moving substrate reach immediately below corresponding lenses in the lens array, the lens array is irradiated with a laser light, and the plurality of lenses focuses and projects the laser light for annealing the amorphous silicon layer in each of the TFT forming regions.

CITATION LIST

Patent Literature

[PTL 1] Japanese Patent Application Publication No. 2010-283073

According to the conventional method, a pulsed laser that oscillates at a repetition frequency of about 50 Hz is used as a laser light source, and it takes significant working time to laser anneal a high resolution or large size substrate entirely, which is disadvantageous in terms of throughput improvement. To address this, the throughput may be improved using a pulsed laser that oscillates at a high frequency of about 6000 Hz, but the conveying speed (scanning speed) of the substrate is raised in the case, and it would be difficult to achieve position control for irradiating a particular location of the substrate with the laser light with a high degree of position accuracy.

Meanwhile, in the process of laser annealing, a channel region is selectively irradiated with a laser light in a TFT region disposed for each of a plurality of pixel electrodes or subpixels arranged in a dot-matrix. However, when the amorphous silicon layer of the entire channel region is changed into polysilicon, the electron mobility is raised and reverse direction current cannot be kept low, which raises the off-current. Therefore, the potential holding characteristic is degraded and current leakage may increase, which may increase power consumption. Meanwhile, when a designed position of the channel region is laser annealed and the irradiation position by the laser light varies in the channel-width direction, the switching characteristic may vary among the TFTs, and therefore a laser light pattern must be irradiated within a channel width of about 4 μm with high accuracy.

SUMMARY OF INVENTION

One or more embodiments of the present invention improve laser annealing throughput and provide a TFT with high electron mobility and reduced variation in the switching characteristic by irradiating a laser light pattern for laser annealing with high accuracy within the channel width of the TFT.

A thin film transistor substrate according to one or more embodiments of the present invention has the following configuration.

A thin film transistor substrate having a plurality of thin film transistors arranged in columns and rows on a substrate, wherein each of the thin film transistors includes a laser annealed part in which an amorphous silicon layer that forms a channel region is laser annealed to be a polysilicon layer, and each laser annealed part is disposed with a designed pitch in a scanning direction in which a laser light for laser annealing and the substrate move relatively to each other, and the laser annealed part is provided within the channel width formed in a direction orthogonal to the scanning direction and is narrower than the channel width.

In the thin film transistor substrate according to one or more embodiments, when a laser light to be irradiated in laser annealing has increased the pulse frequency, so that the speed of scanning the substrate with the laser light is increased, the leaser annealed part can be formed with high positional accuracy within the channel width despite a slight positional deviation of the annealed part in the scanning direction because the channel width is formed in the direction orthogonal to the scanning direction. In this way, a TFT substrate with high electron mobility and reduced variation in the switching characteristic can be provided while the scanning speed and the pulse frequency of the laser light are increased for the purpose of improving the throughput.

DETAILED DESCRIPTION OF EMBODIMENTS

Figure 1:
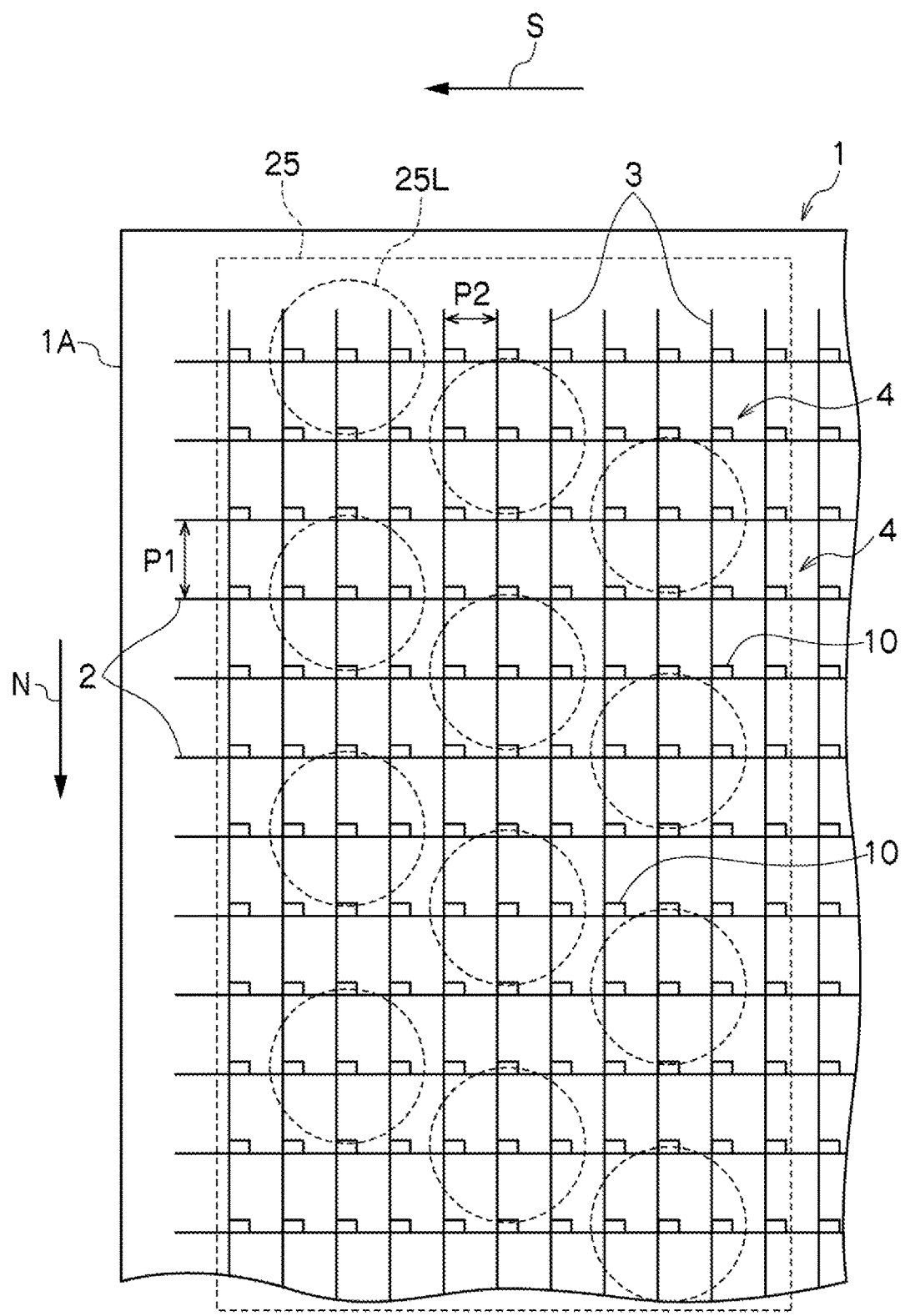
FIG. 1 is a schematic view for illustrating a structure of a TFT substrate.

Now, embodiments of the present invention will be described with reference to the accompanying drawings. As shown in FIG. 1, a TFT substrate 1 has a plurality of data lines 2 and gate lines 3 formed in columns and rows on a substrate, TFTs 10 are formed in the vicinity of intersections of the data lines 2 and the gate lines 3, and a transparent electrode forming part 4 is disposed for each of the TFTs 10. In this way, the TFT substrate 1 has a plurality of TFTs 10 arranged in columns and rows on a substrate 1A. In the illustrated example, the data lines 2 are provided with a pitch P1, the gate lines 3 are provided with a pitch P2, and the TFTs 10 are arranged in a dot-matrix of columns with the pitch P1 and rows with the pitch P2.

As shown in FIG. 1, in the process of laser annealing for manufacturing the TFT substrate 1, a pattern of the gate lines 3 is formed on the substrate 1A, the gate lines 3 are covered with a gate insulating film, then an amorphous silicon layer is provided thereon, and a designed position to form a channel region of a TFT 10 is irradiated with a laser light for annealing.

Figure 2:
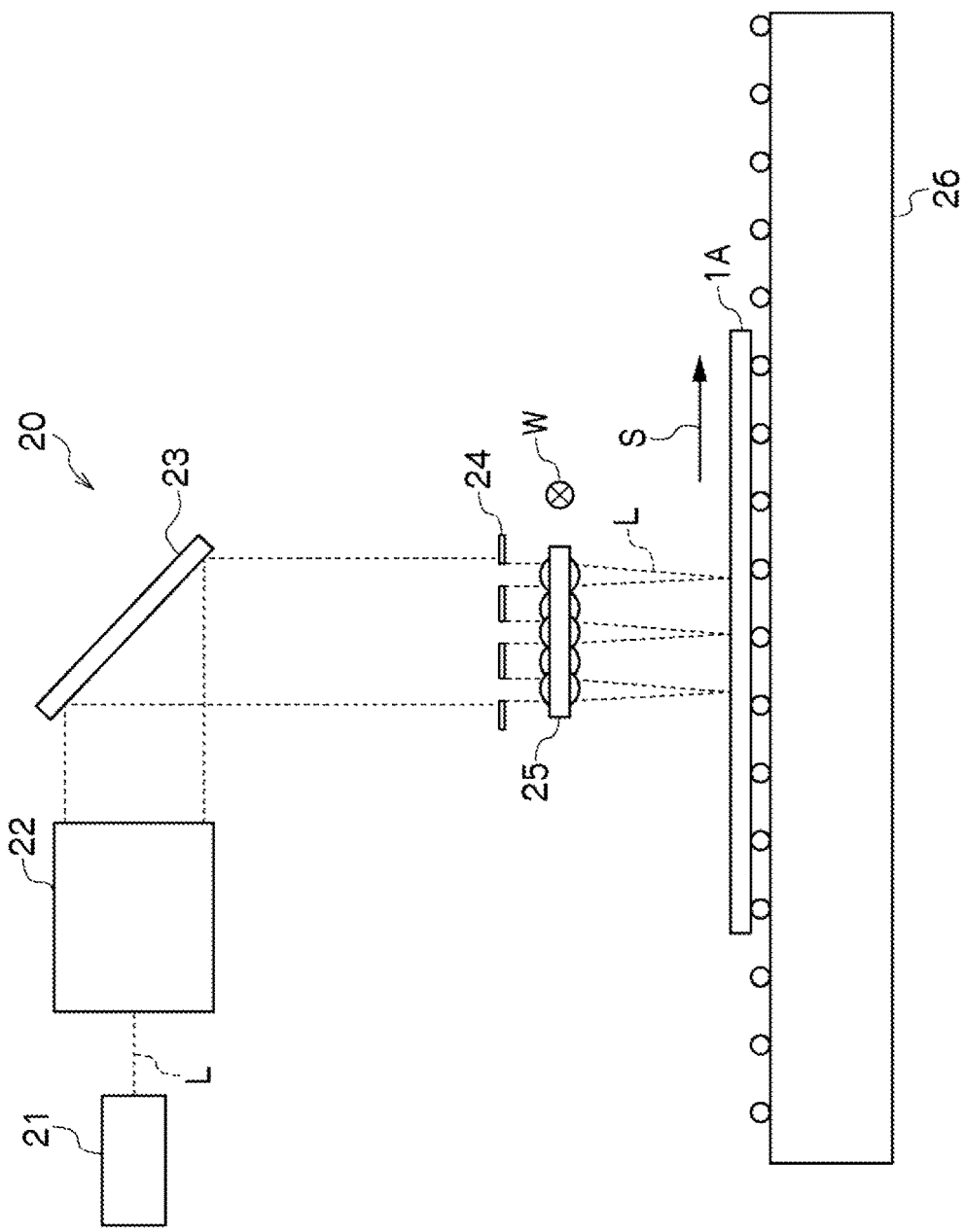
FIG. 2 is a schematic view for illustrating laser annealing.

FIG. 2 shows a general idea of how laser annealing is performed. A laser light L is irradiated by a laser light irradiating device 20. The laser light irradiating device 20 includes a laser light source 21 that emits the laser light L at an optimized pulse frequency, a beam homogenizer 22 adapted to homogeneously irradiate the emitted laser light L within a prescribed space, an irradiation optical system 23 such as a mirror, a mask 24, and a microlens array 25. Here, the mask 24 and the microlens array 25 each have an arrangement pattern corresponding to designed positions to form channel regions in TFTs 10 on the substrate 1A.

As shown in FIG. 2, in the process of laser annealing, while the substrate 1A having an amorphous silicon layer formed thereon is conveyed in one axial direction (scanning direction S) by a substrate conveying device 26, the substrate 1A is irradiated with the laser light L at an optimized pulse frequency from the laser light source 21, and the substrate 1A and the laser light L are scanned in the one axial direction. In this way, the laser light L focused and projected by the microlens array 25 is selectively irradiated on a plurality of designed positions arranged on the substrate 1A. While the substrate 1A is conveyed in the one axial direction and scanned in this example, the substrate 1A and the laser light L need only move relatively to each other in the one axial direction, and therefore the laser light L may be moved instead of conveying the substrate 1A.

As shown in FIG. 1, in order to irradiate the laser light L on designed positions in the TFTs 10 arranged in the matrix of columns and rows, the plurality of lenses 25L of the microlens array 25 are each arranged to correspond to a designed position in one TFT 10, the substrate 1A and the laser light L are scanned in one axial direction (scanning direction S) while the microlens array 25 is moved in the direction orthogonal to the one axial direction (N direction in FIG. 1), and the laser light L is focused and projected on the designed positions through the lenses 25L.

Figure 3:
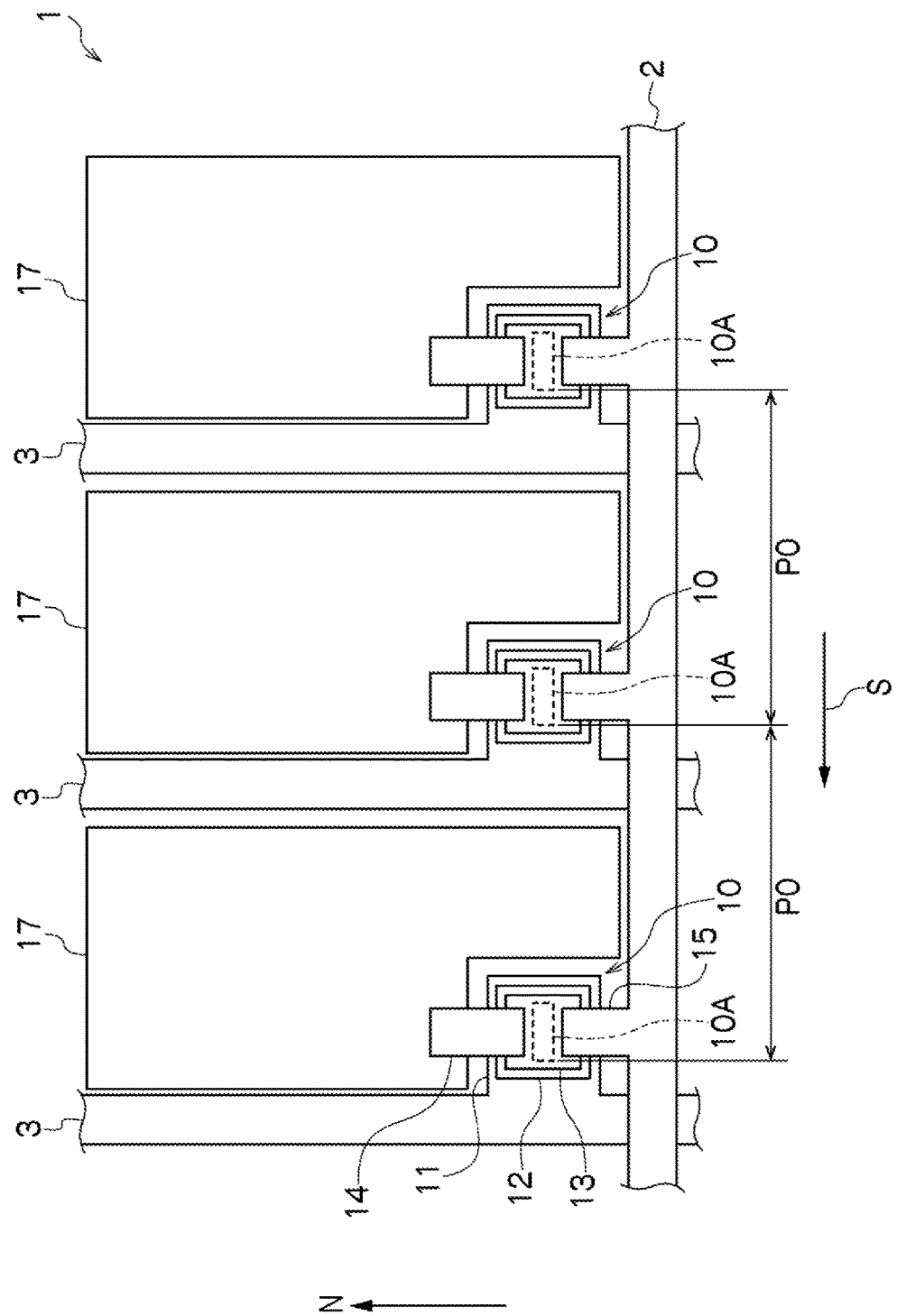
FIG. 3 is a view for illustrating a structure of a TFT substrate according to one or more embodiments of the present invention.
Figure 4A:
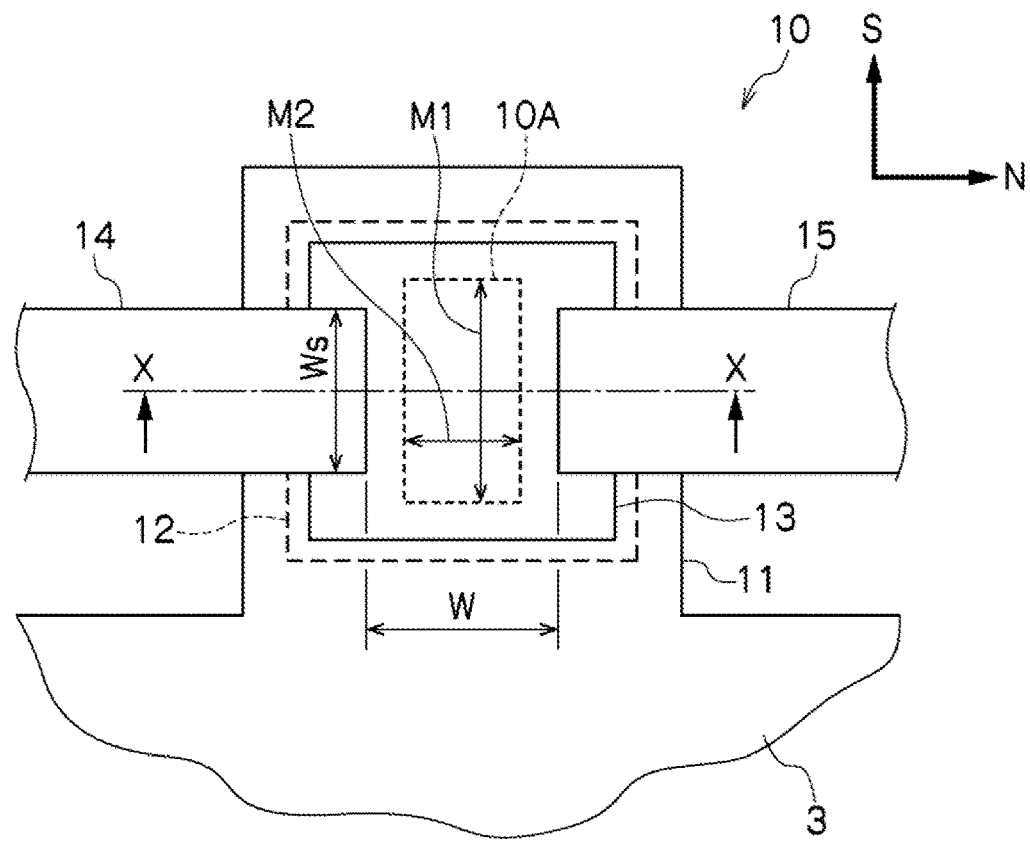
FIG. 4A is a plan view of a TFT structure in the TFT substrate according to one or more embodiments of the present invention.
Figure 4B:
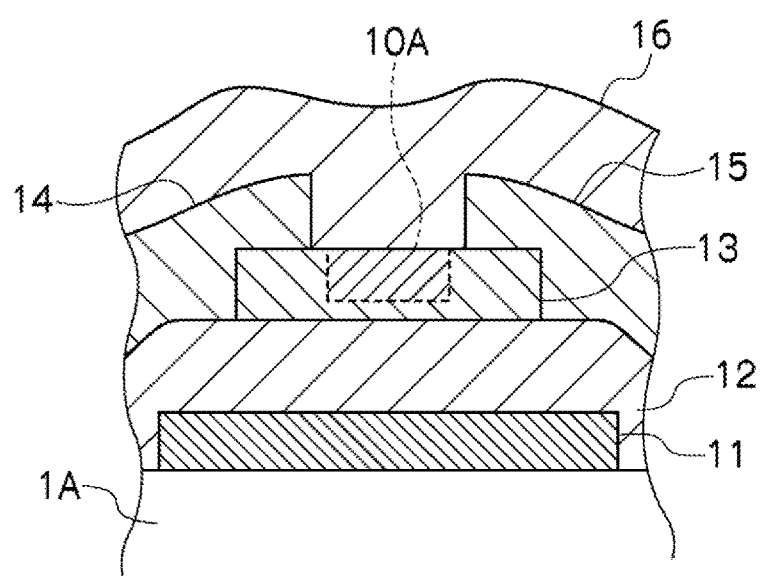
FIG. 4B is a sectional view taken along line X-X in FIG. 4A.

FIG. 3 and FIG. 4 show an exemplary structure of the TFT substrate 1 formed by the laser annealing treatment. As described above, the TFT 10 is formed in the vicinity of the intersection of the data line 2 and the gate line 3 and essentially includes a gate electrode 11, a gate insulating film 12, an amorphous silicon layer 13 that forms a channel region, source/drain electrodes 14 and 15, and a passivation layer 16, and the source/drain electrode 14 is connected to a transparent conductive pattern 17 that forms a pixel or a subpixel. In this way, the TFT 10 is disposed for each of the plurality of transparent conductive patterns 17 arranged in columns and rows on the substrate 1A.

The TFT 10 includes a laser annealed part 10A formed by the laser annealing treatment. The laser annealed part 10A is a portion in which an amorphous silicon layer 13 that forms the channel region is laser annealed to be a polysilicon layer, and partially forms a polysilicon layer in the amorphous silicon layer 13.

The laser annealed part 10A is disposed with a designed pitch P0 in the scanning direction S in which the laser light L for laser annealing and the substrate 1A move relatively to each other and has a pattern for laser light irradiation within a channel width W formed in the direction N orthogonal to the scanning direction S. The channel width W is formed in the direction N orthogonal to the scanning direction S, and the laser annealed part 10A is formed within the channel width W, so that the positional accuracy of the laser annealed part 10A in the direction of the channel width W can be secured if the laser annealed part 10A is formed in a deviated position in the scanning direction S.

The position of the laser annealed part 10A in the scanning direction S is determined by the designed pitch P0 based on the scanning speed and the pulse frequency of the laser light L, while when the scanning speed and the pulse frequency are increased for the purpose of improving the throughput, laser oscillation may be delayed relative to output of a pulse signal, because of which a positional error in the scanning direction S is more likely to be generated. To address this, the direction of the channel width W is arranged orthogonal to the scanning direction S, so that the positional error in the scanning direction S does not affect the positional accuracy of the laser annealed part 10A in the direction of the channel width W.

High positional accuracy for the laser annealed part 10A in the direction of the channel width W can be obtained by mechanical positional adjustment of the microlens array independently of the scanning speed and the pulse frequency of the laser light L. In this way, in the laser annealed part 10A, increasing in the scanning speed and the pulse frequency for the purpose of improving the throughput does not cause any adverse effects, and necessary positional accuracy can be secured within the channel width W.

As shown in FIG. 4, the laser annealed part 10A has a width M1 in the scanning direction S that is greater than a width M2 in the direction orthogonal to the scanning direction S and the length (width M1) in the scanning direction S is greater than the length of the channel width W (the width Ws of the source/drain electrodes 14 and 15) in the scanning direction S. In this way, a positional error for the laser annealed part 10A in the scanning direction S is absorbed by the length of the width M1, so that the laser annealed part 10A may be positioned within the channel width W. In this case, the laser annealed part 10A may obtain a polysilicon layer by crystallizing the entire channel region or by crystallization in a particular pattern in the channel region.

The TFT substrate 1 having the laser annealed part 10A can increase the positional tolerance for increased scanning speed and pulse frequency, so that the throughput may be improved while necessary positional accuracy in the channel-width direction can be secured for the laser annealed part 10A formed during the process and variation in the switching characteristic among the TFTs can be reduced.

As in the foregoing, the TFT substrate 1 according to one or more embodiments of the present invention allows a TFT 10 with high electron mobility to be obtained since the laser annealed part 10A to be a polysilicon layer is formed in the channel region of the amorphous silicon layer 13 in the TFT 10.

The scanning direction S for forming the laser annealed part 10A is set in the direction orthogonal to the direction of the channel width W of the TFT 10, so that when the pulse frequency of the laser light L to be irradiated for laser annealing is increased and the speed of scanning the substrate 1A with the laser light L is increased, the position of the laser annealed part 10A in the direction of the channel width W may be set with high accuracy despite a slight positional deviation of the laser annealed part 10A in the scanning direction S. In this way, a TFT substrate having a high potential holding characteristic and operating with low power consumption can be obtained and variation in the characteristic among the TFTs 10 can be reduced while increasing the scanning speed and the pulse frequency of the laser light for the purpose of improving the throughput.

A display panel such as a liquid crystal panel or an organic EL panel having the TFT substrate 1 as an active matrix substrate can achieve high productivity and low power consumption when the panel is provided as a high definition/high resolution panel.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCE SIGNS LIST

1 Thin film transistor substrate (TFT substrate)
1A Substrate
2 Data line
3 Gate line
4 Transparent electrode forming part
10 Thin film transistor (TFT)
10A Laser annealed part
11 Gate electrode
12 Gate insulating film
13 Amorphous silicon layer
14, 15 Source/drain electrode
16 Passivation layer
17 Transparent conductive pattern
20 Laser light irradiating device
21 Laser light source
22 Beam homogenizer
23 Irradiation optical system
24 Mask
25 Microlens array
25L Lens
26 Substrate conveying device
L Laser light
W Channel width
S Scanning direction

The invention claimed is:

1. A thin film transistor substrate comprising:
a plurality of thin film transistors arranged in columns and rows respectively on a substrate, wherein
each of the thin film transistors comprises a laser annealed part in which an amorphous silicon layer that forms a channel region is laser annealed to be a polysilicon layer,
each laser annealed part is disposed with a designed pitch in a scanning direction in which a laser light for laser annealing and the substrate move relatively to each other, and
the laser annealed part is provided within a channel width formed in a direction orthogonal to the scanning direction and being narrower than the channel width.

2. The thin film transistor substrate according to claim 1, wherein the designed pitch is set based on a scanning speed at which the laser light and the substrate move relatively to each other, and a pulse frequency of the laser light.

3. The thin film transistor substrate according to claim 1, wherein the annealed part has a larger width in the scanning direction than a width in a direction orthogonal to the scanning direction.

4. The thin film transistor substrate according to claim 1, wherein the laser annealed part has a larger length in the scanning direction than the channel width in the scanning direction.

5. The thin film transistor substrate according to claim 1, wherein each thin film transistor is disposed for each of a plurality of transparent electrode patterns arranged in columns and rows respectively on the substrate, and
the transparent electrode pattern has a shorter width in the scanning direction than a width in a direction orthogonal to the scanning direction.

6. A display panel comprising the thin film transistor substrate of claim 1.

7. A laser annealing method, including:
moving a microlens array including a plurality of lenses disposed in a direction orthogonal to one axial direction while scanning a substrate and a laser light in the one axial direction;
focusing and projecting, through the lens, the laser light on a designed position to be a channel region of a thin film transistor; and
forming a laser annealed part in the designed position, in which an amorphous silicon layer on the substrate to be a polysilicon layer, wherein
the laser annealed part is arranged with a designed pitch in the one axial direction, and
the laser annealed part in a prescribed shape is formed within a channel width to be formed in a direction orthogonal to the scanning direction.

8. The laser annealing method according to claim 7, wherein the designed pitch is set based on a speed of the scanning and a pulse frequency of the laser light.

9. The laser annealing method according to claim 7, wherein the laser annealed part has a larger length in the scanning direction than the channel width in the scanning direction.

* * * * *